(12) United States Patent
Kobayashi et al.

(10) Patent No.: US 10,017,858 B2
(45) Date of Patent: Jul. 10, 2018

(54) COATING MATERIAL FILLING AND DISCHARGING DEVICE

(71) Applicants: TOYOTA JIDOSHA KABUSHIKI KAISHA, Toyota-shi, Aichi-ken (JP); TRINITY INDUSTRIAL CORPORATION, Toyota-shi, Aichi (JP)

(72) Inventors: Shunya Kobayashi, Nagoya (JP); Isamu Yamasaki, Toyota (JP); Fumio Kose, Okazaki (JP); Yoshimi Hamada, Toyota (JP); Katsuhiro Ishikawa, Toyota (JP)

(73) Assignees: TOYOTA JIDOSHA KABUSHIKI KAISHA, Toyota (JP); TRINITY INDUSTRIAL CORPORATION, Toyota (JP)

( * ) Notice: Subject to any disclaimer, the term of this patent is extended or adjusted under 35 U.S.C. 154(b) by 0 days.

(21) Appl. No.: 15/691,030

(22) Filed: Aug. 30, 2017

(65) Prior Publication Data

US 2018/0073148 A1    Mar. 15, 2018

(30) Foreign Application Priority Data

Sep. 13, 2016   (JP) ................................. 2016-179004

(51) Int. Cl.
*B65B 1/30* (2006.01)
*C23C 16/52* (2006.01)

(52) U.S. Cl.
CPC ..................................... *C23C 16/52* (2013.01)

(58) Field of Classification Search
CPC ..................................................... C23C 16/52
See application file for complete search history.

(56) References Cited

U.S. PATENT DOCUMENTS

2010/0212774 A1    8/2010   Yamasaki et al.
2010/0243101 A1    9/2010   Matsumoto

FOREIGN PATENT DOCUMENTS

| JP | 2009-056382 A | 3/2009 |
| JP | 2012-071222 A | 4/2012 |
| WO | 2008/065794 A1 | 6/2008 |

*Primary Examiner* — Jason K Niesz
(74) *Attorney, Agent, or Firm* — Oliff PLC

(57) ABSTRACT

A coating material filling and discharging device includes a coating material supply part configured to supply a coating material to a coating material storage bag arranged inside a case of a coating material cartridge, an extrusion liquid supply part configured to supply extrusion liquid to a surrounding region outside the coating material storage bag within the case, and store the extrusion liquid discharged from the case, an extrusion liquid route that connects an extrusion liquid supply part and the surrounding region with each other, a flowmeter provided in the extrusion liquid route, and a control part configured to determine whether or not filling of the coating material in the coating material cartridge is completed based on a drop of flow speed of the extrusion liquid.

8 Claims, 13 Drawing Sheets

COATING MATERIAL FILLING AND DISCHARGING DEVICE

INCORPORATION BY REFERENCE

The disclosure of Japanese Patent Application No. 2016-179004 filed on Sep. 13, 2016 including the specification, drawings and abstract is incorporated herein by reference in its entirety.

BACKGROUND

1. Technical Field

The disclosure relates to a coating material filling and discharging device.

2. Description of Related Art

Generally, in a coating device for coating a coated object such as a vehicle body, a detachable coating material cartridge is mounted, which can be filled with a coating material repeatedly. A coating material filling and discharging device is known, which fills a coating material to the coating material cartridge and supplies extrusion liquid into the coating material cartridge when a deteriorated coating material remains in the coating material cartridge so that the deteriorated coating material is discharged. As the coating material filling and discharging device supplies the extrusion liquid to the coating material cartridge, the same amount of the coating material as that of the supplied extrusion liquid is discharged. On the contrary, as the coating material filling and discharging device fills the coating material in the coating material cartridge, the same amount of the extrusion liquid as that of the filled coating material is discharged.

International Unexamined Patent Application No. 2008/065794 describes the coating material filling and discharging device described above, which is provided with a measuring chamber, into which the extrusion liquid discharged from the coating material cartridge flows, and a piston that is pushed and moved by the extrusion liquid when the extrusion liquid is flown into the measuring chamber. Based on displacement of the piston, a discharged amount of the extrusion liquid is measured, and a filling amount of the coating material is measured. Since the same amount of the extrusion liquid as that of the coating material filled in the coating material cartridge is discharged as described above, it is said that, by measuring a discharged amount of the extrusion liquid based on displacement of the piston, it is possible to accurately measure an amount of the coating material filled in the coating material cartridge.

SUMMARY

Incidentally, in the coating material filling and discharging device, it is necessary to highly accurately detect timing when filling of the coating material into the coating material cartridge is completed, in order to prevent durability of the coating material cartridge from being impaired by overfilling of the coating material. In the coating material filling and discharging device described in International Unexamined Patent Application No. 2008/065794, since it is possible to measure an amount of the coating material filled in the coating material cartridge accurately as stated above, it is possible to highly accurately detect timing when filling of the coating material in the coating material cartridge is completed. However, in the coating material filling and discharging device described in international Unexamined Patent Application No. 2008/065794, it is necessary to provide the measuring chamber and the piston in order to detect completion of filling of the coating material highly accurately. Therefore, there is a problem that the coating material filling and discharging device has a complex structure.

The disclosure provides a coating material filling and discharging device that is able to detect timing when filling of a coating material is completed highly accurately with a simple structure when filling the coating material into a coating material cartridge.

The first aspect of the disclosure is a coating material filling and discharging device, which fills a coating material in a coating material cartridge in which a coating material storage bag is arranged inside a case, and discharges the coating material remaining inside the coating material storage bag by supplying extrusion liquid to a surrounding region outside the coating material storage bag within the case. The coating material filling and discharging device is provided with a coating material supply part configured to supply the coating material to the coating material storage bag, an extrusion liquid supply part configured to supply the extrusion liquid to the surrounding region and store the extrusion liquid discharged from the case, an extrusion liquid route that connects the extrusion liquid supply part and the surrounding region with each other, a flowmeter provided in the extrusion liquid route, and a control part configured to determine whether or not filling of the coating material to the coating material cartridge is completed based on a drop of flow speed of the extrusion liquid, which is detected by the flowmeter, while the coating material is supplied to the coating material storage bag from the coating material supply part. Once the coating material is supplied to the coating material storage bag, the coating material storage bag expands, and the same amount of the extrusion liquid as that of the coating material supplied to the coating material storage bag is discharged from the case. When filling of the coating material to the coating material cartridge is completed, the extrusion liquid in the surrounding region outside the coating material storage bag within the case is gone, causing a rapid drop of flow speed of the extrusion liquid flowing in the extrusion liquid route. Therefore, it is possible to determine whether or not filling of the coating material is completed highly accurately based on a drop of flow speed of the extrusion liquid, which is detected by the flowmeter provided in the extrusion liquid route. Further, the flowmeter, which is provided in the extrusion liquid route, is basically the only component that needs to be added in order to determine whether or not filling of the coating material is completed. Therefore, the coating material filling and discharging device is able to have a simple structure.

Further, the control part may be configured to determine whether or not discharge of the coating material remaining inside the coating material storage bag is completed based on a drop of flow speed of the extrusion liquid, which is detected by the flowmeter, while the extrusion liquid is supplied to the surrounding region from the extrusion liquid supply part. Once the extrusion liquid is supplied to the surrounding region, the coating material storage bag is crushed by the extrusion liquid, and the coating material remaining inside the coating material storage bag is discharged from the coating material storage bag. Once discharge of the coating material remaining inside the coating material storage bag is completed, the extrusion liquid can no longer enter the surrounding region. Therefore, the flow speed of the extrusion liquid flowing in the extrusion liquid route drops rapidly. Therefore, based on a drop of the flow speed of the extrusion liquid, which is detected by the flowmeter provided in the extrusion liquid route, it is possible to determine whether or not discharge of the coating material remaining inside the coating material storage bag is completed highly accurately.

Further, the control part may be configured to determine that the filling of the coating material in the coating material cartridge is completed when flow speed of the extrusion liquid detected by the flowmeter is dropped to a predetermined ratio with respect to a detected value while the coating material is filled in the coating material cartridge. It is possible to determine whether or not filling of the coating material is completed highly accurately by detecting a drop of the flow speed of the extrusion liquid when filling of the coating material in the coating material cartridge is completed based on whether or not the flow speed of the extrusion liquid detected by the flowmeter has dropped to a predetermined ratio with respect to a detected value while the coating material is filled in the coating material cartridge.

Further, the control part may be configured to determine that the filling of the coating material in the coating material cartridge is completed when flow speed of the extrusion liquid detected by the flowmeter is dropped to a predetermined threshold. It is possible to determine whether or not filling of the coating material is completed highly accurately by detecting a drop of the flow speed of the extrusion liquid when filling of the coating material in the coating material cartridge is completed based on whether or not the flow speed of the extrusion liquid detected by the flowmeter has dropped to a predetermined threshold.

Further, the control part may be configured to determine that the discharge of the coating material remaining inside the coating material storage bag is completed when flow speed of the extrusion liquid detected by the flowmeter is dropped to a predetermined ratio with respect to a detected value while the coating material remaining inside the coating material storage bag is discharged. It is possible to determine whether or not discharge of the coating material is completed highly accurately by detecting a drop of the flow speed of the extrusion liquid when discharge of the coating material remaining inside the coating material storage bag is completed based on whether or not the flow speed of the extrusion liquid detected by the flowmeter has dropped to a predetermined ratio with respect to a detected value while the coating material remaining inside the coating material storage bag is discharged.

Further, the control part may be configured to determine that the discharge of the coating material remaining inside the coating material storage bag is completed when flow speed of the extrusion liquid detected by the flowmeter is dropped to a predetermined threshold. It is possible to determine whether or not discharge of the coating material is completed highly accurately by detecting a drop of the flow speed of extrusion liquid when discharge of the coating material remaining inside the material storage bag is completed based on whether or not the flow speed of the extrusion liquid detected by the flowmeter has dropped to a predetermined threshold.

The second aspect of the disclosure is a coating material filling and discharging device, which fills a coating material in a coating material cartridge in which a coating material storage bag is arranged inside a case, and discharges the coating material remaining inside the coating material storage bag by supplying extrusion liquid to a surrounding region outside the coating material storage bag within the case. The coating material filling and discharging device is provided with a coating material supply part configured to supply the coating material to the coating material storage bag, an extrusion liquid supply part configured to supply the extrusion liquid to the surrounding region and store the extrusion liquid discharged from the case, an extrusion liquid route that connects the extrusion liquid supply part and the surrounding region with each other, a pressure gauge provided in the extrusion liquid route, and a control part configured to determine whether or not filling of the coating material in the coating material cartridge is completed based on a pressure drop of the extrusion liquid, which is detected by the pressure gauge, while the coating material is supplied to the coating material storage bag from the coating material supply part. Once the coating material is supplied to the coating material storage bag, the coating material storage bag expands, and the same amount of the extrusion liquid as that of the coating material supplied to the coating material storage bag is discharged from the case. Once filling of the coating material in the coating material cartridge is completed, the extrusion liquid in the surrounding region outside the coating material storage bag within the case is gone, and pressure of the extrusion liquid flowing in the extrusion liquid route thus drops rapidly. Therefore, it is possible to determine whether or not filling of the coating material in the coating material cartridge is completed highly accurately based on a pressure drop of the extrusion liquid, which is detected by the pressure gauge provided in the extrusion liquid route. Further, the pressure gauge, which is provided in the extrusion liquid route, is basically the only component that needs to be added in order to determine whether or not filling of the coating material is completed. Therefore, the coating material filling and discharging device is able to have a simple structure.

Furthermore, the control part may be configured to determine whether or not discharge of the coating material remaining inside the coating material storage bag is completed based on a pressure increase of the extrusion liquid detected by the pressure gauge while the extrusion liquid is supplied to the surrounding region. When the extrusion liquid is supplied to the surrounding region, the coating material storage bag is crushed by the extrusion liquid, and the coating material remaining inside the coating material storage bag is discharged from the coating material storage bag. Once discharge of the coating material remaining inside the coating material storage bag is completed, the extrusion liquid can no longer enter the surrounding region. Therefore, pressure of the extrusion liquid flowing in the extrusion liquid route increases rapidly. Thus, it is possible to determine whether or not discharge of the coating material remaining in the coating material storage bag is completed highly accurately based on a pressure increase of the extrusion liquid, which is detected by the pressure gauge provided in the extrusion liquid route.

According to the disclosure, in filling the coating material in the coating material cartridge, it is possible to highly accurately determine timing when filling of the coating material is completed, with a simple structure.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

The First Embodiment

Herein below, the first embodiment of the disclosure is explained with reference to the drawings.

Figure 1:
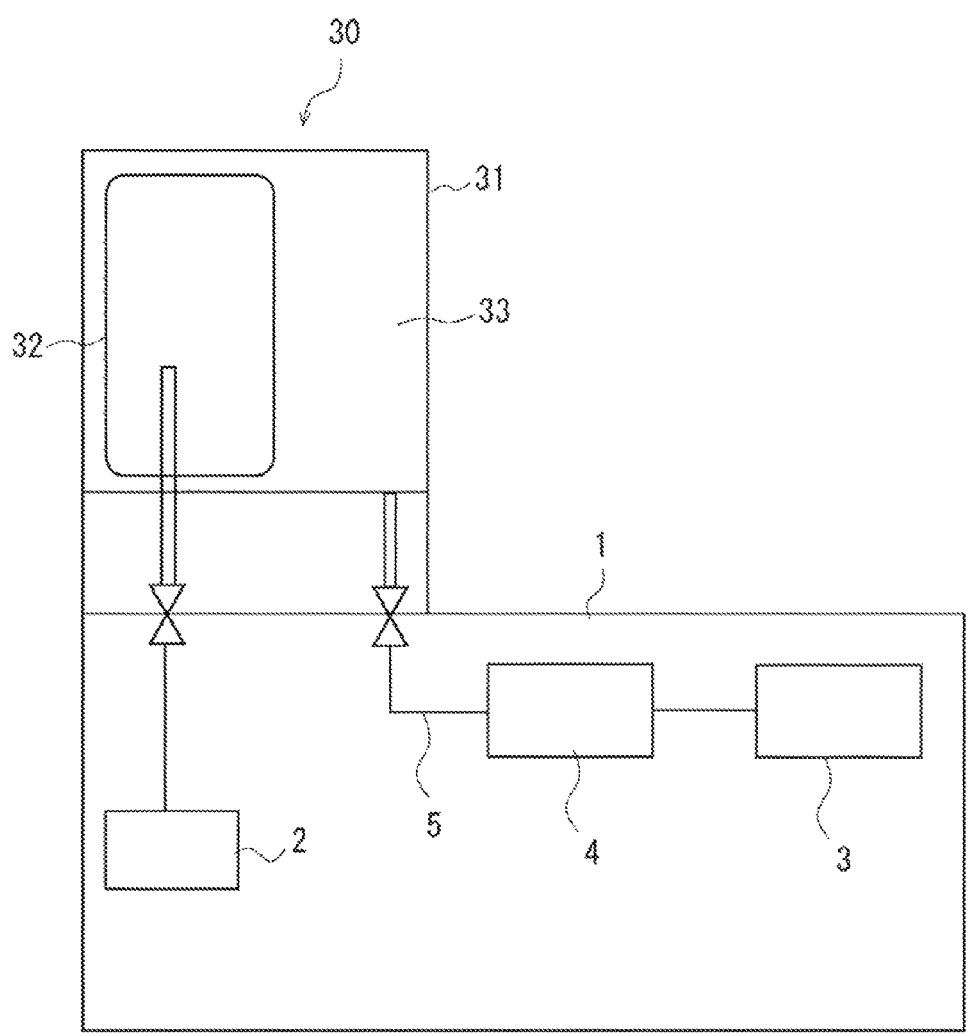
FIG. 1 is a view of a general structure of a coating material filling and discharging device according to the first embodiment.

First of all, with reference to FIG. 1, a schematic structure of a coating material filling and discharging device 1 according to this embodiment is explained. FIG. 1 is a view of the schematic structure of the coating material filling and discharging device 1 according to this embodiment. As shown in FIG. 1, the coating material filling and discharging device 1 fills a coating material in a coating material cartridge 30 in which a coating material storage bag 32 is arranged inside a case 31. The coating material filling and discharging device 1 also supplies extrusion liquid to a surrounding region 33 outside the coating material storage bag 32 inside the case 31 so that the coating material inside the coating material storage bag 32 is discharged. Here, the coating material storage bag 32 is, for example, a flexible and deformable resin bag. The coating material filling and discharging device 1 is provided with a coating material supply part 2, an extrusion liquid supply part 3, an extrusion liquid route 5, and a flowmeter 4.

The coating material supply part 2 supplies the coating material to the coating material storage bag 32. The extrusion liquid supply part 3 supplies the extrusion liquid to the surrounding region 33, and stores the extrusion liquid discharged from the case 31. Here, the extrusion liquid is, for example, transparent oily liquid such as organic solvent. The extrusion liquid route 5 connects the extrusion liquid supply part 3 with the surrounding region 33. The flowmeter 4 is provided in the extrusion liquid route 5.

Based on a drop of flow speed of the extrusion liquid, which is detected by the flowmeter 4 while the coating material is supplied from the coating material supply part 2 to the coating material storage bag 32, it is determined whether or not filling of the coating material into the coating material cartridge 30 is completed.

As the coating material is supplied to the coating material storage bag 32, the coating material storage bag 32 expands, and the same amount of the extrusion liquid as that of the coating material supplied to the coating material storage bag 32 is discharged from the case 31. When filling of the coating material in the coating material storage bag 32 is completed, the extrusion liquid in the surrounding region 33 is gone, and flow speed of the extrusion liquid flowing in the extrusion liquid route 5 drops rapidly. Therefore, based on a drop of the flow speed of the extrusion liquid, which is detected by the flowmeter 4 provided in the extrusion liquid route 5, it is possible to determine whether or not filling of the coating material in the coating material cartridge 30 is completed highly accurately. Also, the flowmeter 4 provided in the extrusion liquid route 5 is basically the only component that needs to be added in order to determine whether or not filling of the coating material in the coating material cartridge 30 is completed. Therefore, the coating material filling and discharging device 1 is able to have a simple structure.

Figure 2:
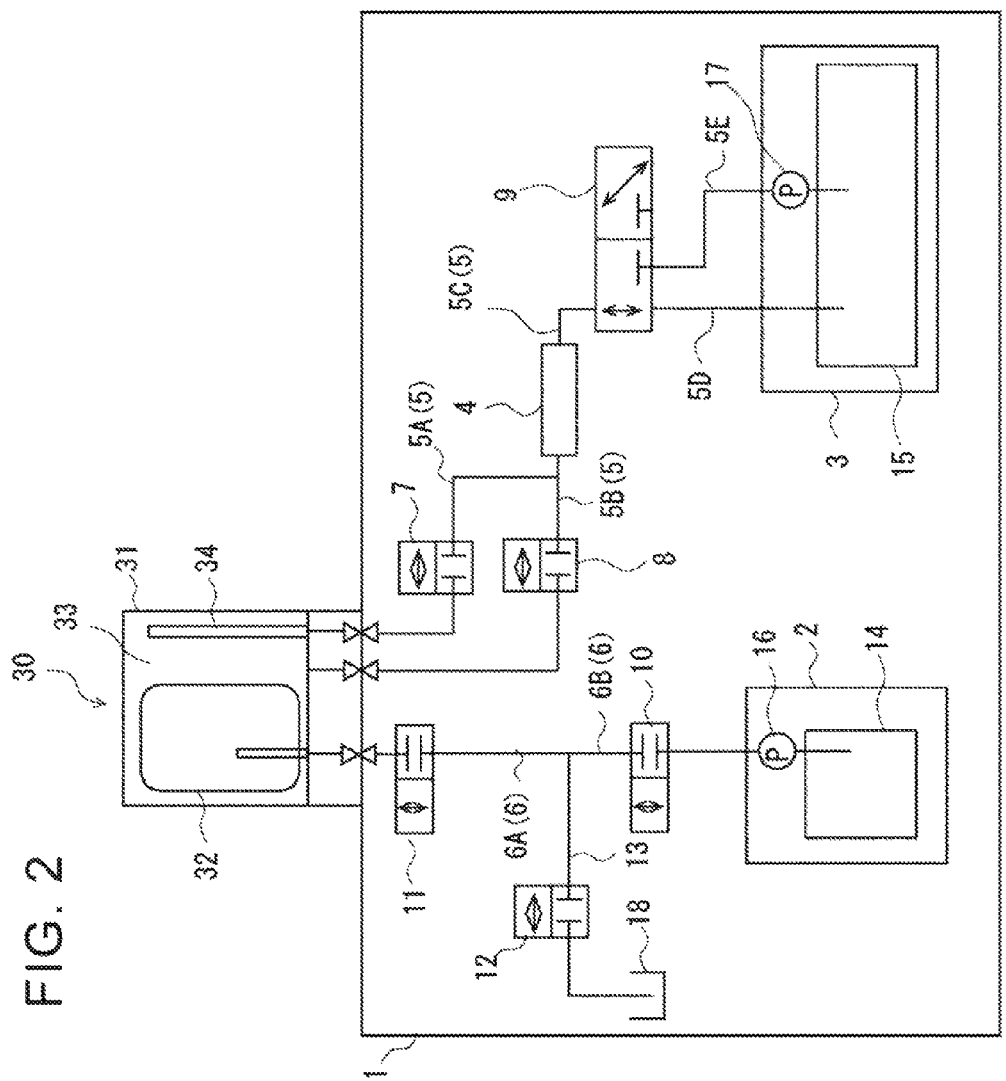
FIG. 2 is a view of a detailed structure of the coating material filling and discharging device according to the first embodiment.

Next, with reference to FIG. 2, a more detailed structure of the coating material filling and discharging device 1 is explained. FIG. 2 is a view of the detailed structure of the coating material filling and discharging device 1. As shown in FIG. 2, the coating material filling and discharging device 1 is provided with the coating material supply part 2, the extrusion liquid supply part 3, the extrusion liquid route 5, and the flowmeter 4. The coating material supply part 2 supplies the coating material to the coating material storage bag 32 arranged inside the coating material cartridge 30. In the coating material cartridge 30, it is preferred that a capacity of the coating material storage bag 32 is larger than a capacity of inside of the case 31. Thus, it is possible to restrain a breakage of the coating material storage bag 32 due to overfilling. The extrusion liquid supply part 3 supplies the extrusion liquid to the surrounding region 33 outside the coating material storage bag 32 within the case 31, and also stores the extrusion liquid discharged from the case 31.

The extrusion liquid route 5 includes a route 5A, a route 5B, a route 5C, a route 5D, and a route 5E. One end of the route 5A is connected with an extrusion liquid moving tube 34, and the other end is connected with one end of the route 5C. Here, the extrusion liquid moving tube 34 is arranged in the surrounding region 33 of the coating material cartridge 30. In the route 5A, an extrusion liquid OUT valve 7 is provided, which opens and closes a flow passage. One end of the route 5B is connected with an inner side of the case 31, and the other end is connected with one end of the route 5C. In the route 5B, an extrusion liquid IN valve 8 is provided, which opens and closes the flow passage.

The foregoing flowmeter 4 is provided in the route 5C of the extrusion liquid route 5. The other end of the route 5C is connected with a switching valve 9. One end of the route 5D and one end of the route 5E are connected with the switching valve 9. The switching valve 9 is a three-way switching valve, and switches between a state where the route 5C and the route 5E are communicated with each other and the route 5D is blocked, and a state where the route 5C and the route 5D are communicated with each other and the route 5E is blocked. The switching valve 9 switches the flow passage using, for example, a solenoid. The other end of the route 5D and the other end of the route 5E are connected with a later-described extrusion liquid tank 15.

The extrusion liquid supply part 3 is provided with an extrusion liquid tank 15 and an extrusion liquid pump 17. The extrusion liquid tank 15 stores the extrusion liquid. The extrusion liquid pump 17 supplies the extrusion liquid from the extrusion liquid tank 15 towards the route 5E.

A coating material route 6 includes a route 6A and a route 6B. One end of the route 6A is connected with inside of the coating material storage bag 32, and the other end is connected with one end of the route 6B. In the route 6A, a trigger valve 11 is provided, which opens and closes a flow passage. The other end of the route 6B is connected with a coating material tank 14. In the route 6B, a color change valve 10 is provided, which opens and closes the flow passage.

The coating material supply part 2 is provided with the coating material tank 14 and a coating material pump 16. The coating material tank 14 stores the coating material. The coating material pump 16 supplies the coating material from the coating material tank 14 towards the route 6B.

One end of a route 13 is connected between the route 6A and the route 6B. The other end of the route 13 is connected with a waste liquid tank 18. The waste liquid tank 18 receives residual coating material discharged from inside of the coating material storage bag 32 in the coating material cartridge 30. In the route 13, a dump valve 12 is provided, which opens and closes a flow passage.

Figure 3:
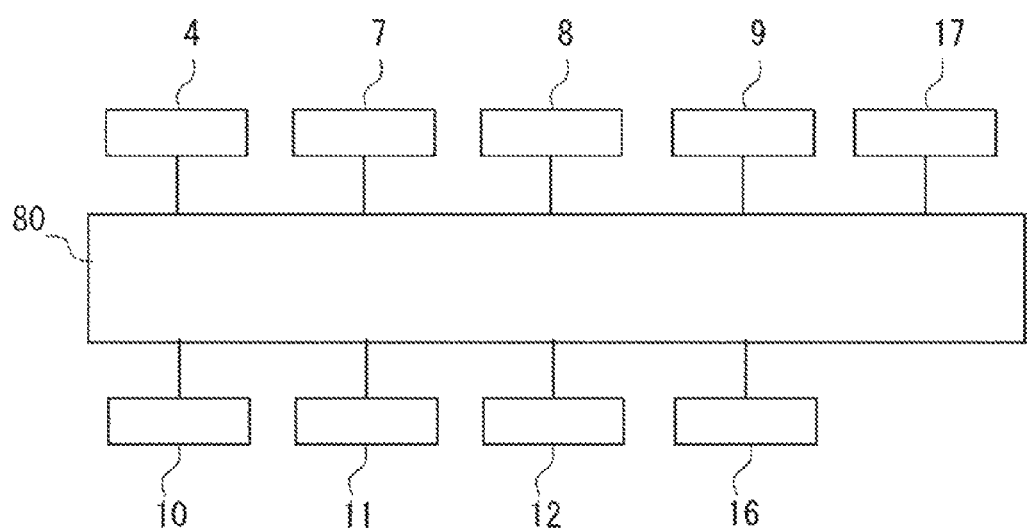
FIG. 3 is a block diagram of a control system of the coating material filling and discharging device according to the first embodiment.

FIG. 3 is a block diagram of a control system of the coating material filling and discharging device 1. As shown in FIG. 3, the coating material filling and discharging device 1 is provided with a control part 80. The flowmeter 4, the extrusion liquid OUT valve 7, the extrusion liquid IN valve 8, the switching valve 9, the color change valve 10, the trigger valve 11, the dump valve 12, the coating material pump 16, and the extrusion liquid pump 17 are connected with the control part 80. The control part 80 controls an operation of each of the connected devices by using a built-in CPU, memory and so on. The memory stores information for controlling each of the devices.

Here, processing of filling the coating material in the coating material cartridge 30 is explained with reference to the drawings.

Figure 4:
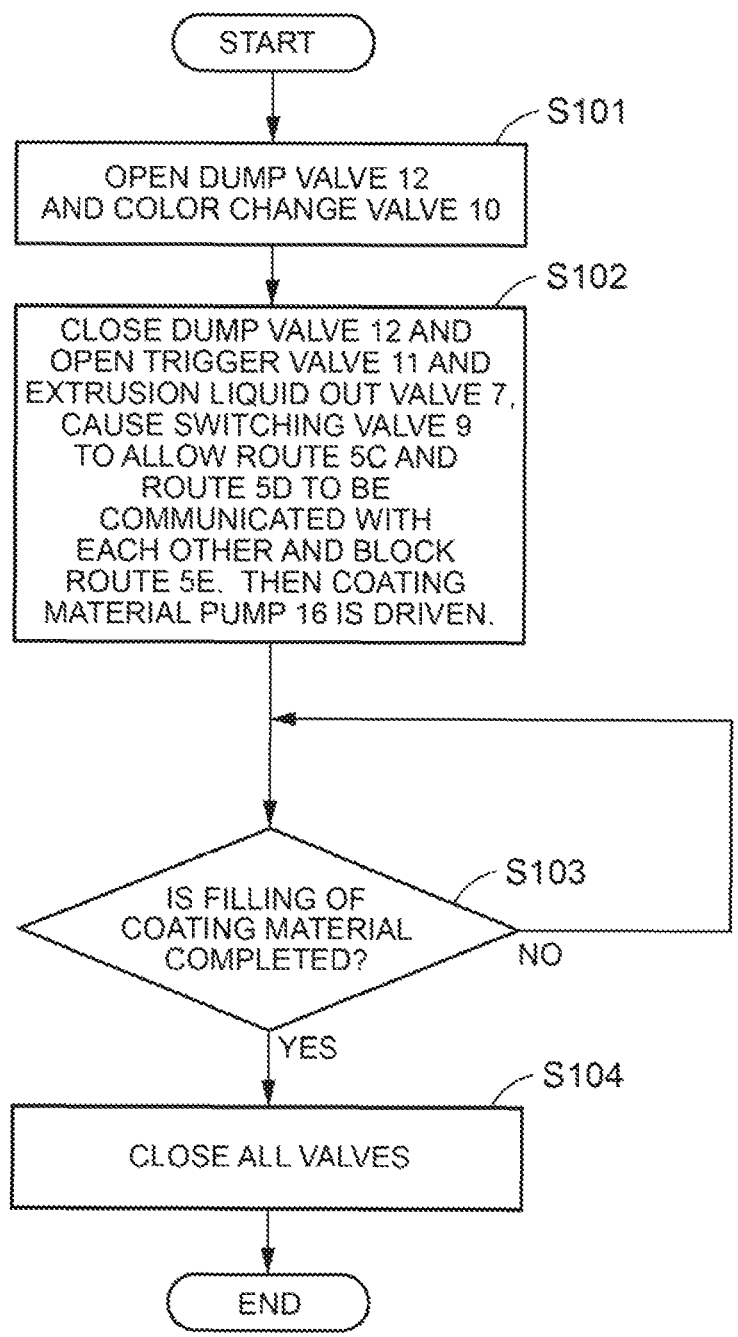
FIG. 4 is a flowchart showing a flow of processing of filling a coating material in a coating material cartridge.

First, a flow of processing of filling the coating material in the coating material cartridge 30 is explained. In the explanation below, FIG. 2, which shows the structure of the coating material filling and discharging device 1, and FIG. 3, which shows the control system of the coating material filling and discharging device 1 are also referred to appropriately. FIG. 4 is a flowchart showing a flow of the processing of filling the coating material in the coating material cartridge 30. As shown in FIG. 4, first of all, in a state where the coating material cartridge 30 is set in the coating material filling and discharging device 1, the control part 80 opens the dump valve 12 and the color change valve 10, and fills the coating material in the coating material route 6 (step S101).

After step S101, the control part 80 closes the dump valve 12 and opens the trigger valve 11 and the extrusion liquid OUT valve 7, and causes the switching valve 9 to allow the route 5C and the route 5D to be communicated with each other and block the route 5E. Then, the coating material pump 16 is driven to supply the coating material to the coating material storage bag 32 (step S102). Then, based on a drop of flow speed of the extrusion liquid, which is detected by the flowmeter 4 while the coating material is supplied to the coating material storage bag 32 from the coating material supply part 2, the control part 80 determines whether or not filling of the coating material has completed (step S103). In step S103, when it is determined that filling of the coating material is completed, all of the valves are closed and the processing ends (step S104).

Figure 5:
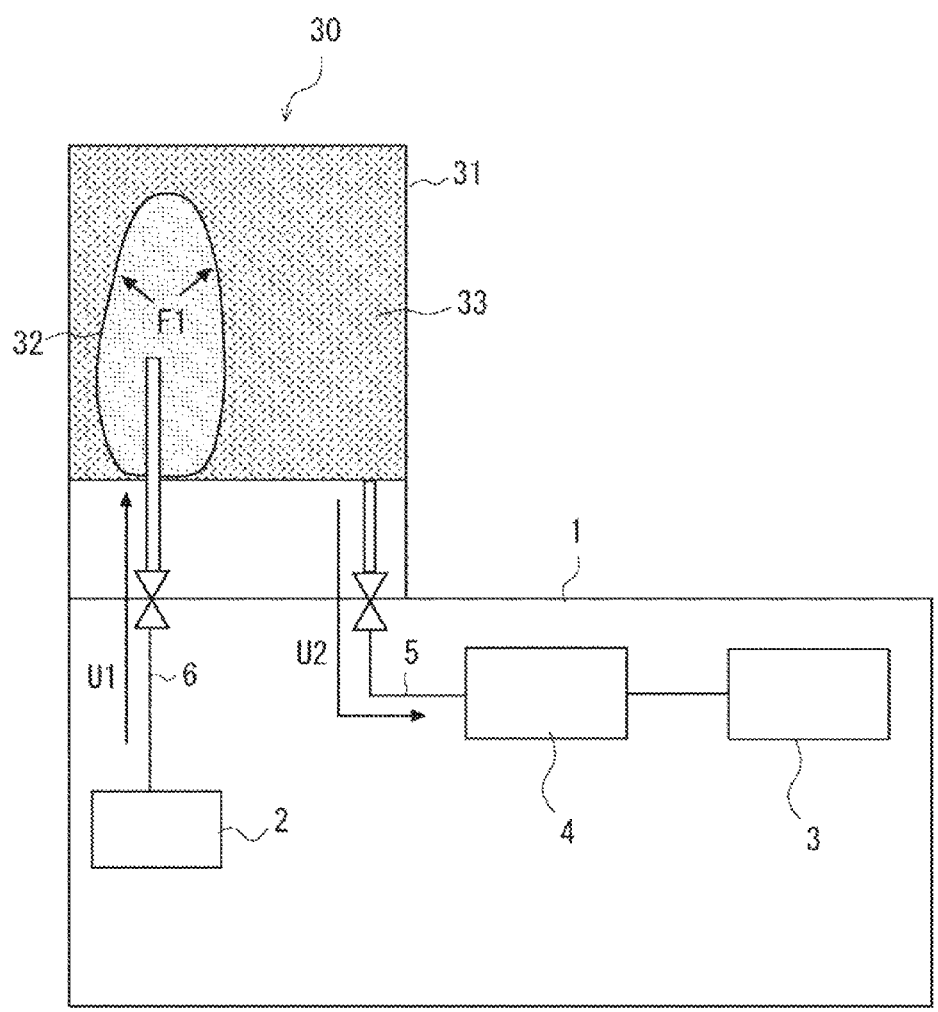
FIG. 5 is a schematic view of a process in which the coating material is filled in the coating material cartridge.
Figure 6:
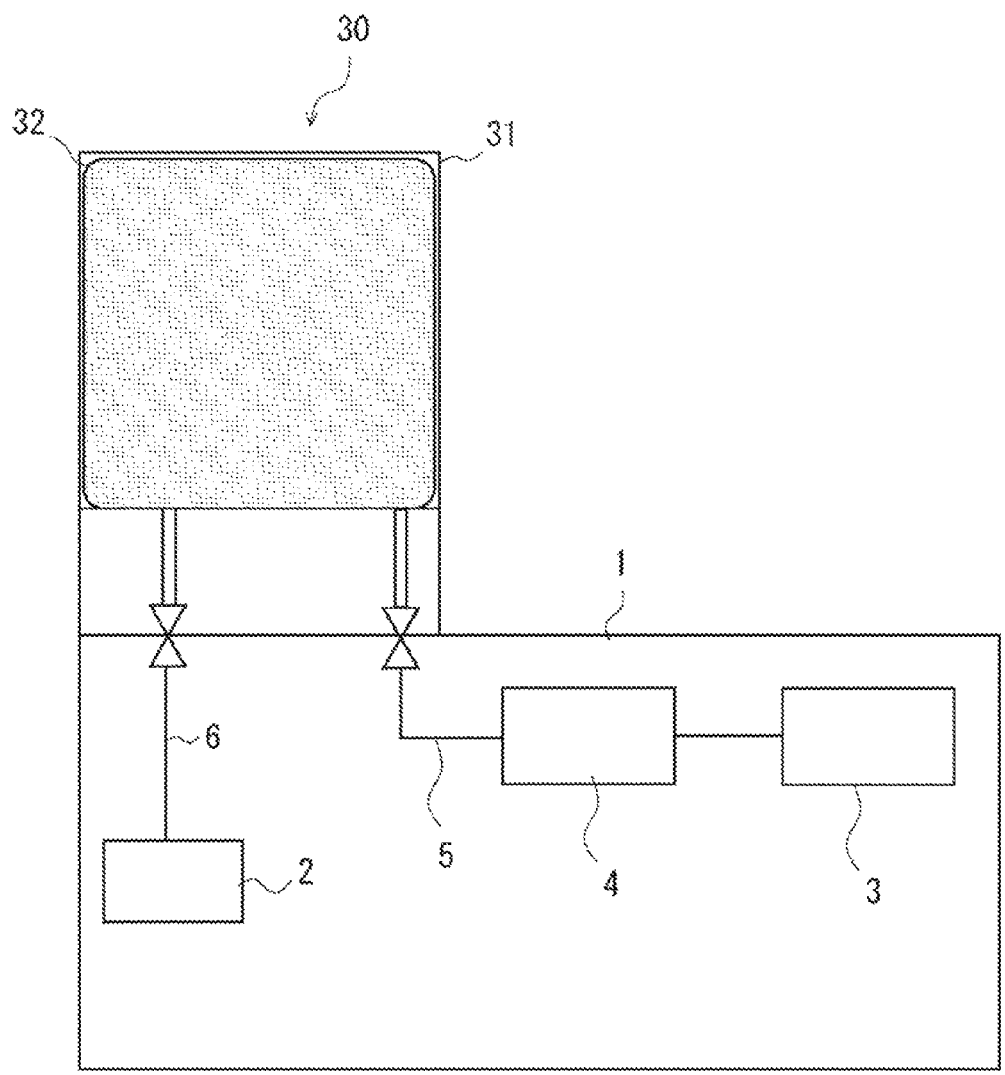
FIG. 6 is a schematic view of a process in which the coating material is filled in the coating material cartridge.

Next, explanation is given regarding a method for determining whether or not filling of the coating material to the coating material cartridge 30 is completed based on a drop of flow speed, which is detected by the flowmeter 4. FIG. 5 and FIG. 6 are views schematically showing processes of filling the coating material in the coating material cartridge 30. Here, the capacity of the coating material storage bag 32 is larger than the capacity of inside of the case 31.

As shown in FIG. 5, once the processing of filling the coating material begins, the coating material is supplied to the coating material storage bag 32 from the coating material supply part 2 through the coating material route 6. In the drawings, an arrow U1 shows a flow direction of the coating material in the coating material route 6. Once the coating material is supplied to the coating material storage bag 32 from the coating material supply part 2, force F1 is applied by the supplied coating material to inside of the coating material storage bag 32, and the coating material storage bag 32 expands. As the coating material storage bag 32 expands and the capacity of the coating material storage bag 32 increases, the capacity of the surrounding region 33 is decreased accordingly. Because of this, the same amount of extrusion liquid as that of the coating material supplied to the coating material storage bag 32 is discharged from the case 31, and returned to the extrusion liquid supply part 3 through the extrusion liquid route 5. In the drawings, an arrow U2 shows a flow direction of the extrusion liquid. Flow speed of the extrusion liquid flowing in the extrusion liquid route 5 is substantially the same as flow speed of the coating material supplied to the coating material storage bag 32.

As shown in FIG. 6, as the coating material is supplied, the capacity of the coating material storage bag 32 increases, and inside of the case 31 of the coating material cartridge 30 is occupied by the coating material storage bag 32, the coating material storage bag 32 no longer expands. When the coating material storage bag 32 cannot expand any more, it is no longer possible to supply the coating material to the coating material storage bag 32 from the coating material supply part 2. When it is no longer possible to supply the coating material to the coating material storage bag 32 from the coating material supply part 2, it is regarded as completion of filling of the coating material cartridge 30. Once it is no longer possible to supply the coating material to the coating material storage bag 32 from the coating material supply part 2, the extrusion liquid is no longer discharged from the case 31.

Figure 7:
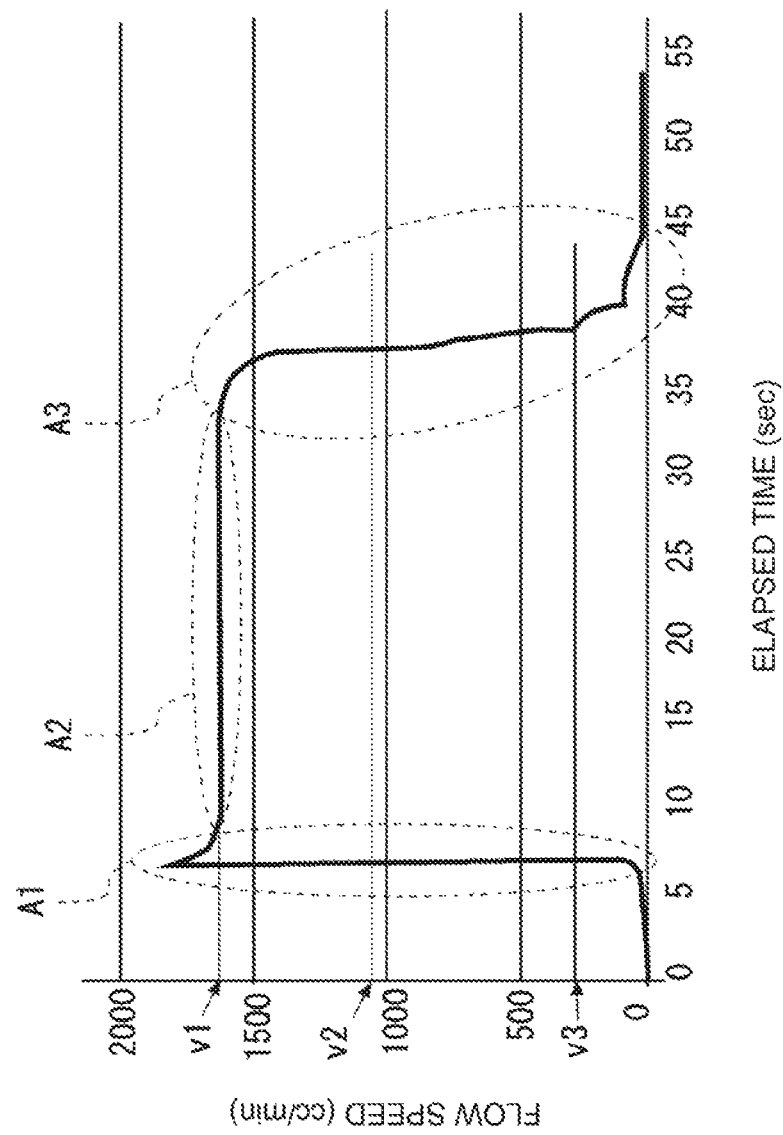
FIG. 7 is a view explaining changes in flow speed of extrusion liquid flowing in an extrusion liquid route in the process of filling the coating material in the coating material cartridge.

FIG. 7 is a view explaining changes of flow speed of the extrusion liquid flowing in the extrusion liquid route 5 in the process of filling the coating material in the coating material cartridge 30 explained by using FIG. 5 and FIG. 6. The horizontal axis of the graph represents elapsed time (sec) and the vertical axis of the graph represents flow speed (cc/min) of the extrusion liquid, which is detected by the flowmeter 4. A part shown by the broken line A1 in FIG. 7 is a build up part. The build up part shows a transient state immediately after start of supplying of the coating material to the coating material storage bag 32. This means that, in the build up part, flow speed of the extrusion liquid increases instantaneously. A part shown by the broken line A2 in FIG. 7 is a stable part. The stable part shows a state where flow speed of the extrusion liquid is stable while the coating material is filled in the coating material cartridge 30. This means that, in the stable part, changes of flow speed of the extrusion liquid are kept substantially constant while the coating material is filled in the coating material cartridge 30. A pan shown by the broken line A3 in FIG. 7 is a complete part. The complete part shows a transient state when supply of the coating material to the coating material storage bag 32 is completed. This means that, in the complete part, because filling of the coating material in the coating material cartridge 30 is completed, it becomes no longer possible to supply the coating material to the coating material storage bag 32 from the coating material supply part 2, and the extrusion liquid is no longer discharged from the case 31. Therefore, flow speed of the extrusion liquid drops rapidly. Therefore, when flow speed of the extrusion liquid, which is detected by the flowmeter 4, drops rapidly like the complete part shown by the broken line A3 in FIG. 7, it is possible to determine that filling of the coating material in the coating material cartridge 30 is completed. Thus, it is possible to detect timing when filling of the coating material in the coating material cartridge 30 is completed highly accurately.

In the build up part shown by the broken line A1 in FIG. 7, in a case where flow speed of the extrusion liquid does not increase instantaneously, it is considered that the coating material cartridge 30 is not mounted on the coating material filling and discharging device 1 properly. In this case, a warming may be notified regarding a failure in mounting the coating material cartridge 30.

When flow speed v of the extrusion liquid, which is detected by the flowmeter 4, is dropped to a predetermined ratio with respect to a detected value while the coating material is filled in the coating material cartridge 30, it may be determined that filling of the coating material in the coating material cartridge 30 is completed. As stated above, in the stable part shown by the broken line A2 in FIG. 7, changes in flow speed of the extrusion liquid are substantially kept constant. Flow speed of the extrusion liquid detected by the flowmeter 4 in the stable part (a detected value v1 in the stable part) is regarded as a detected value while the coating material is filled in the coating material cartridge 30, and stored in, for example, a memory or the like built in the control part 80 (see FIG. 3). Then, the control part 80 determines whether or not the flow speed v of the extrusion liquid detected by the flowmeter 4 is dropped to a predetermined ratio with respect to the detected value v1 in the stable part.

For example, it is assumed that the predetermined ratio is 60%. As shown in FIG. 7, when the detected value v1 in the stable part is 1700 cc/min, flow speed v2 of the extrusion liquid, which is 60% of the detected value v1 in the stable part, is 1020 cc/min (1700 cc/min×0.6=1020 cc/min). When the flow speed v of the extrusion liquid is decreased to v2 (1020 cc/min), the control part 80 determines that filling of the coating material in the coating material cartridge 30 has completed.

When the flow speed v of the extrusion liquid detected by the flowmeter 4 is dropped to a predetermined threshold, it may be determined that filling of the coating material in the coating material cartridge 30 is completed. However, when determining completion of filling of the coating material in the coating material cartridge 30 as stated above, it is necessary to determine a threshold for each kind of the coating material filled in the coating material cartridge 30. On the contrary, in a case of the method in which, as stated above, completion of filling of the coating material in the coating material cartridge 30 is determined when the flow speed v of the extrusion liquid detected by the flowmeter 4 is dropped to a predetermined ratio with respect to the detected value v1 while the coating material is filled in the coating material cartridge 30, it is possible to detect timing when filling of the coating material in the coating material cartridge 30 is completed highly accurately regardless of a type of the coating material filled in the coating material cartridge 30.

In determining whether or not filling of the coating material in the coating material cartridge 30 is completed, a combination of the foregoing two methods may be used. The foregoing two methods means the determination method by using a predetermined ratio with respect to a detected value while the coating material is filled in the coating material cartridge 30, and the determining method by using the predetermined threshold.

In the complete part shown by the broken line A3 in FIG. 7, when the flow speed v of the extrusion liquid is lower than a boundary value v3 (300 cc/min), the flow speed v of the extrusion liquid drops more gently (a drop of the flow speed of the extrusion liquid per unit time is smaller) compared to a case where the flow speed v of the extrusion liquid is the boundary value v3 or higher. Thus, when the detected value v1 in the stable part is close to the boundary value v3 (for example, v1=400 cc/min), it takes longer from a point where filling of the coating material cartridge 30 is completed until it is actually determined that filling of the coating material cartridge 30 is completed, compared to a case where the detected value v1 in the stable part is sufficiently larger than the boundary value v3 (for example, v1=1700 cc/min). When it takes longer from a point where filling of the coating material cartridge 30 is completed until it is actually determined that filling of the coating material cartridge 30 is completed, the coating material storage bag 32 is overfilled by the amount of time lengthened. This can deteriorate durability of the coating material cartridge 30.

Thus, it is determined that filling of the coating material in the coating material cartridge 30 is completed when the flow speed v of the extrusion liquid is dropped to a predetermined ratio with respect to the detected value v1 in the stable part, or when the flow speed v is dropped to a predetermined threshold. The predetermined threshold is, for example, the foregoing boundary value v3 (300 cc/min). As shown in FIG. 7, in the case where the detected value v1 in the stable part is 1700 cc/min that is sufficiently larger than v3, when the flow speed v of the extrusion liquid is dropped to a flow speed v2 (1020 cc/min), which is 60% of the detected value v1 in the stable part, it is determined that filling of the coating material in the coating material cartridge 30 is completed even if the flow speed v is not decreased to a predetermined threshold (that means the boundary value v3=300 cc/min). Meanwhile, in a case where the detected value v1 in the stable part is 400 cc/min, which is close to v3, it is determined that filling of the coating material in the coating material cartridge 30 is completed when the flow speed v of the extrusion liquid is dropped to a predetermined threshold (that is the boundary value v3=300 cc/min), even if the flow speed v is not dropped to flow speed of the extrusion liquid (400 cc×0.6=240 cc), which is 60% of the detected value v1 in the stable part. As stated above, when determining whether or not filling of the coating material in the coating material cartridge 30 is completed, by using a combination of the above-mentioned two methods, it becomes possible to restrain deterioration of durability of the material cartridge 30 due to overfilling.

Figure 8:
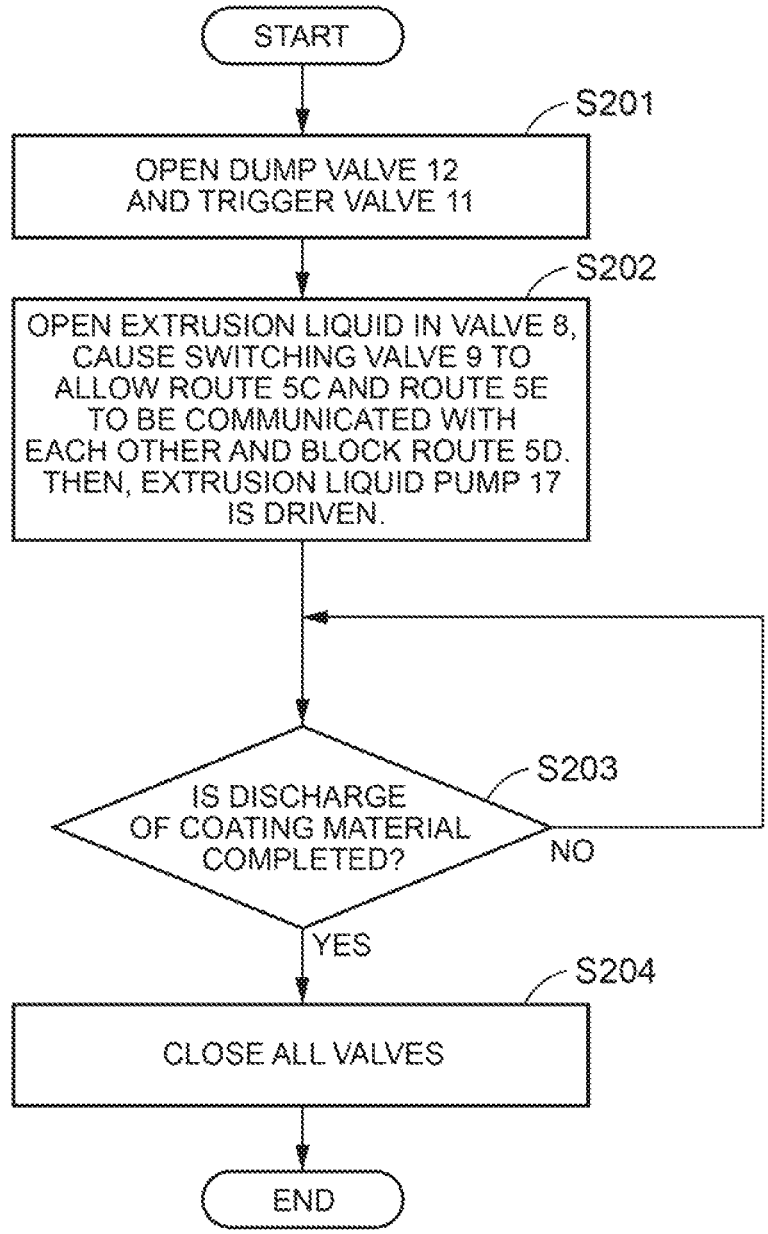
FIG. 8 is a flowchart showing a flow of processing of discharging the coating material remaining in the coating material storage bag.

Next, processing of discharging the coating material remaining inside the coating material storage bag 32 is explained. In the explanation below, FIG. 2, which shows the structure of the coating material filling and discharging device 1, and FIG. 3, which shows the control system of the coating material filling and discharging device 1, are also referred to as appropriate. FIG. 8 is a flowchart showing a flow of the processing of discharging the coating material remaining inside the coating material storage bag 32. As shown in FIG. 8, first of all, in a state where the coating material cartridge 30 is set in the coating material filling and discharging device 1, the control part 80 opens the dump valve 12 and the trigger valve 11 (step S201).

Subsequently to step S201, the control part 80 opens the extrusion liquid IN valve 8, causes the switching valve 9 to allow the route 5C and the route 5E to be communicated with each other and block the route 5D, and drives the extrusion liquid pump 17, thereby supplying the extrusion liquid to outside of the coating material storage bag 32 within the case 31 of the coating material cartridge 30 (step S202). Then, the control part 80 determines whether or not discharge of the coating material remaining inside the coating material storage bag 32 is completed based on a drop of flow speed of the extrusion liquid, which is detected by the flowmeter 4 while the extrusion liquid is supplied from the extrusion liquid supply part 3 to outside of the coating material storage bag 32 within the case 31 of the coating material cartridge 30 (step S203). When it is determined that discharge of the coating material remaining inside the coating material storage bag 32 is completed in step S203, all the valves are closed, and the processing ends (step S204). Explanation is given later regarding the method for determining whether or not discharge of the coating material remaining inside the coating material storage bag 32 is completed based on a drop of flow speed, which is detected by the flowmeter 4.

Figure 9:
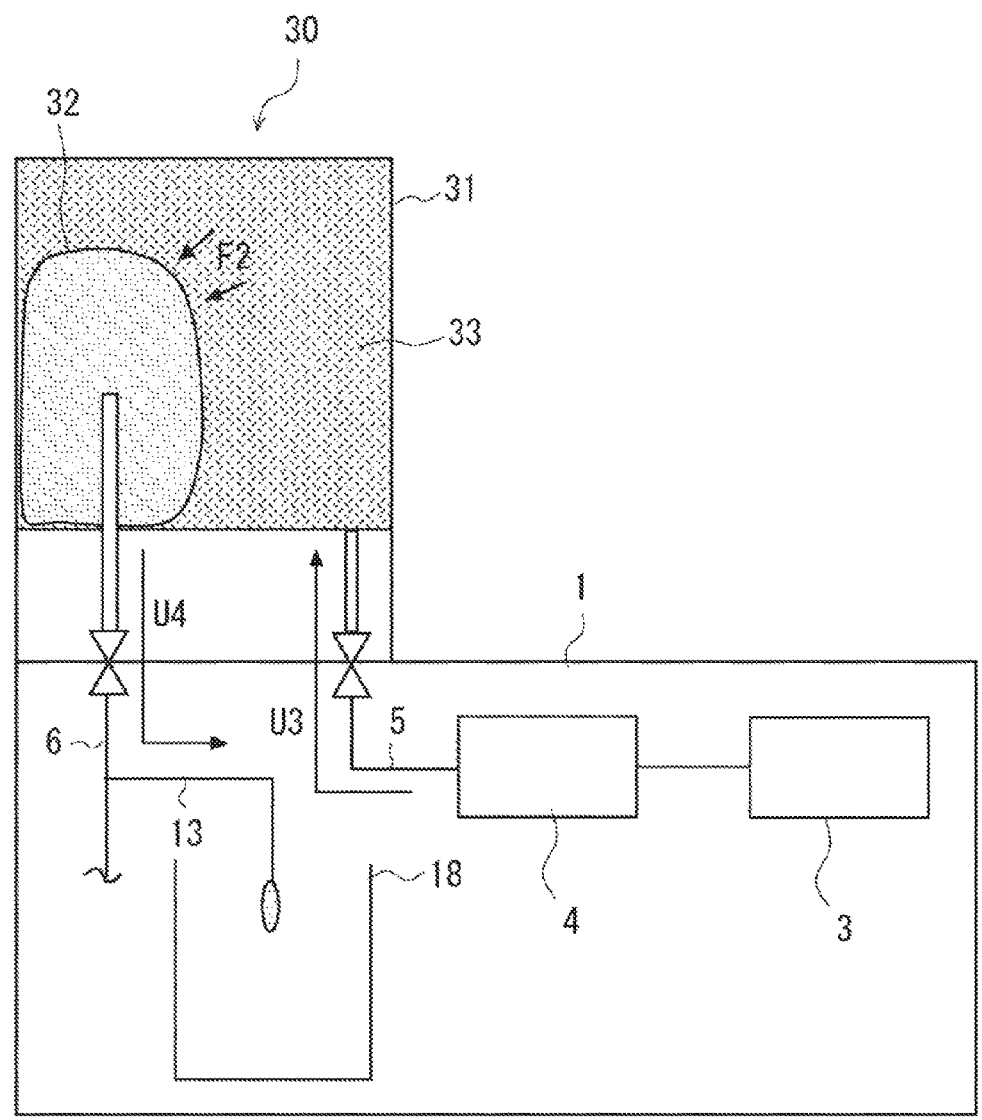
FIG. 9 is a schematic view of a process of discharging the coating material remaining in the coating material storage bag.
Figure 10:
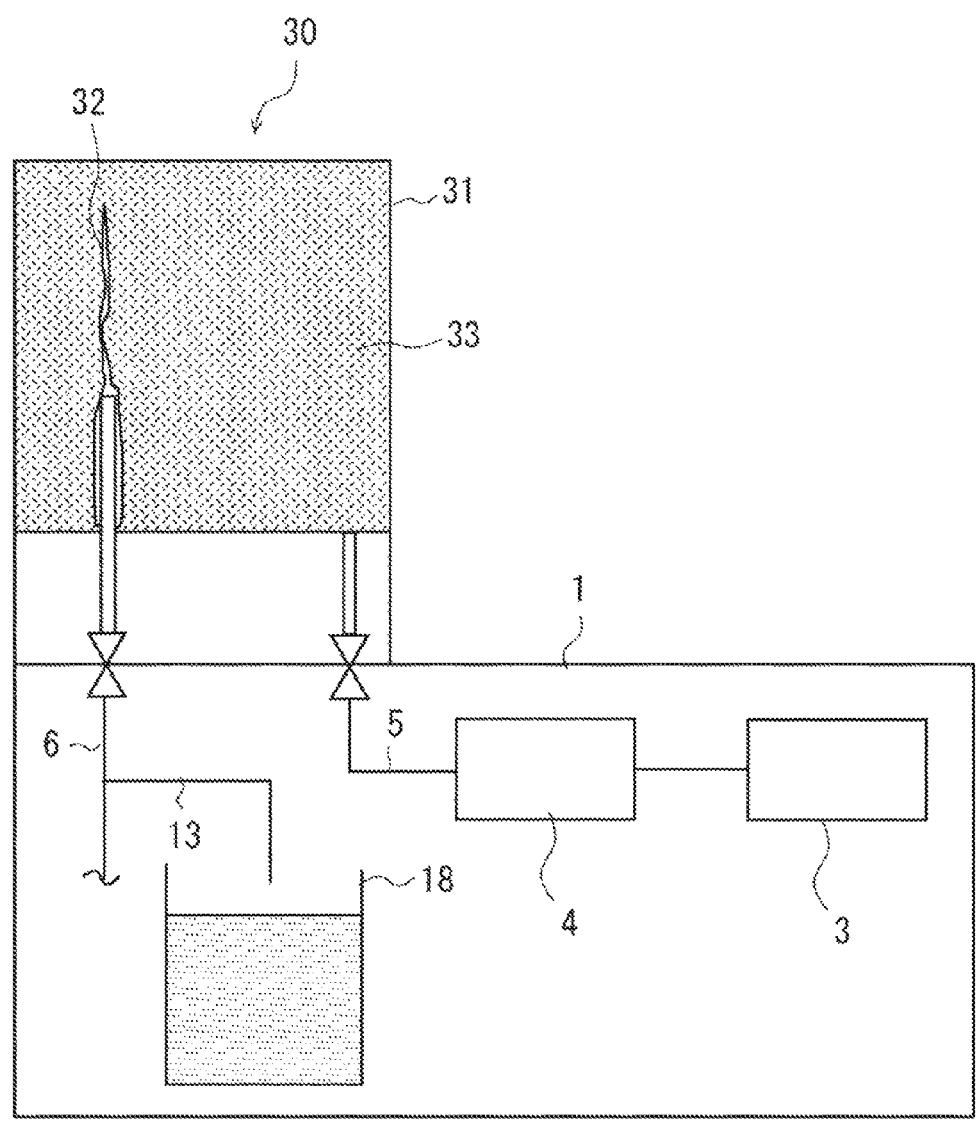
FIG. 10 is a schematic view of a process of discharging the coating material remaining in the coating material storage bag.

Next, explanation is given regarding the method for determining whether or not discharge of the coating material remaining inside the coating material storage bag 32 is completed based on a drop of flow speed, which is detected by the flowmeter 4. FIG. 9 and FIG. 10 are views schematically showing processes of discharging the coating material remaining in the coating material storage bag 32.

As shown in FIG. 9, once discharge processing of the coating material remaining inside the coating material storage bag 32 begins, the extrusion liquid is supplied to the surrounding region 33 from the extrusion liquid supply part 3 through the extrusion liquid route 5. In the drawing, an arrow U3 shows a flow direction of the extrusion liquid in the extrusion liquid route 5. As the coating material is supplied to the coating material storage bag 32 from the coating material supply part 2, force F2 is applied to outside of the coating material storage bag 32 by the supplied extrusion liquid. Because of this, the coating material storage bag 32 is crushed and the coating material remaining inside the coating material storage bag 32 is discharged. As the capacity of the surrounding region 33 is increased, the coating material storage bag 32 is crushed and the capacity of the coating material storage bag 32 is decreased accordingly. Therefore, the same amount of the coating material as that of the extrusion liquid supplied to the surrounding region 33 is discharged from the coating material storage bag 32. The coating material discharged from the coating material storage bag 32 is transferred to the waste liquid tank 18 through the coating material route 6 and the route 13. In the drawing, an arrow U4 shows a flow direction of the coating material in the coating material route 6 and the route 13. Flow speed of the extrusion liquid flowing in the extrusion liquid route 5 is substantially the same as flow speed of the coating material discharged from the coating material storage bag 32.

As shown in FIG. 10, the capacity of the coating material storage bag 32 is decreased as the extrusion liquid is supplied, and eventually the coating material storage bag 32 is no longer crushed. When the coating material storage bag 32 is no longer crushed, the extrusion liquid can no longer be supplied to the surrounding region 33 from the extrusion liquid supply part 3. When the extrusion liquid can no longer be supplied to the surrounding region 33 from the extrusion liquid supply part 3, it is regarded as completion of discharge of the coating material remaining inside the coating material storage bag 32.

In the process of discharging the coating material remaining inside the coating material storage bag 32 explained by using FIG. 9 and FIG. 10, changes in flow speed of the extrusion liquid flowing in the extrusion liquid route 5 are the same as the changes in flow speed of the extrusion liquid flowing in the extrusion liquid route 5, which is shown in FIG. 7, in the process of filling the coating material in the coating material cartridge 30. This means that, as shown by the broken line A1 in FIG. 7, once supply of the extrusion liquid to the surrounding region 33 begins, flow speed of the extrusion liquid increases instantaneously. As shown by the broken line A2 in FIG. 7, while the coating material remaining inside the coating material storage bag 32 is discharged, changes of flow speed of the extrusion liquid are kept substantially constant. As shown by the broken line A3 in FIG. 7, when the extrusion liquid can no longer be supplied to the surrounding region 33 from the extrusion liquid supply part 3 due to completion of discharge of the coating material remaining inside the coating material storage bag 32, flow speed of the extrusion liquid drops rapidly. Therefore, similarly to the foregoing determination about completion of filling of the coating material in the coating material cartridge 30, it is possible to determine that discharge of the coating material remaining inside the coating material storage bag 32 is completed when flow speed of the extrusion liquid detected by the flowmeter 4 drops rapidly as shown by the broken line A3 in FIG. 7. Thus, it is possible to highly accurately detect timing when discharge of the coating material remaining inside the coating material storage bag 32 is completed.

Similarly to the determination of whether or not filling of the coating material in the coating material cartridge 30 is completed, determination may be made that discharge of the coating material remaining inside the coating material storage bag 32 is completed when flow speed v of the extrusion liquid detected by the flowmeter 4 is dropped to a predetermined ratio with respect to a detected value while the coating material remaining inside the coating material storage bag 32 is discharged. Also, when flow speed v of the extrusion liquid, which is detected by the flowmeter 4, is dropped to a predetermined threshold, it may be determined that discharge of the coating material remaining inside the coating material storage bag 32 is completed. Further, in determining whether or not discharge of the coating material remaining in the coating material storage bag 32 is completed, a combination of the foregoing two methods may be used. The foregoing two methods are the determination method using a predetermined ratio with respect to a detected value during discharge of the coating material remaining in the coating material storage bag 32, and the determination method using a predetermined threshold.

The Second Embodiment

Herein below, the second embodiment of the disclosure is explained with reference to the drawings. The same reference numerals are used for the common parts to those of the first embodiment, and explanation of those parts is omitted. A structure of a coating material filling and discharging device according to this embodiment is basically similar to that explained by using FIG. 1 and FIG. 2 in the first embodiment. Further, a block diagram showing a control system of the coating material filling and discharging device according to this embodiment is basically the same as that explained by using FIG. 3 in the first embodiment.

Figure 11:
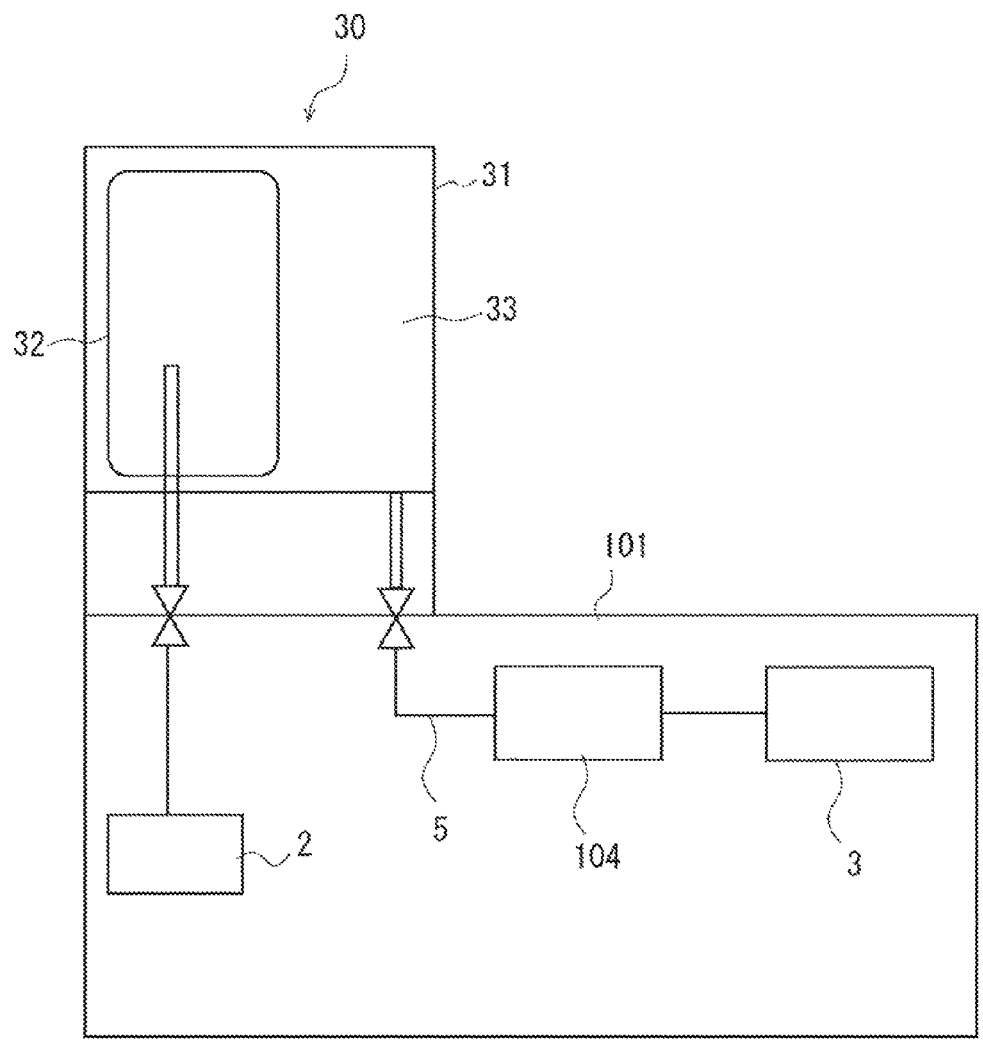
FIG. 11 is a view of a general structure of a coating material filling and discharging device according to the second embodiment.
Figure 12:
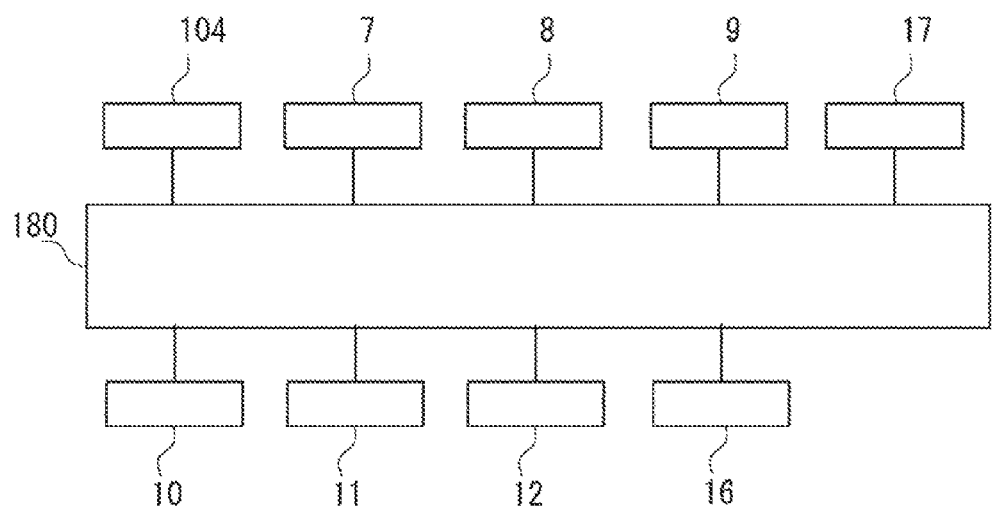
FIG. 12 is a block diagram of a control system of the coating material filling and discharging device according to the second embodiment.

FIG. 11 is a view showing a schematic structure of a coating material filling and discharging device 101 according to this embodiment. FIG. 12 is a block diagram showing a control system of the coating material filling and discharging device 101 according to this embodiment. As shown in FIG. 11, the coating material filling and discharging device 101 according to the embodiment is different from the coating material filling and discharging device 1 according to the first embodiment in that a pressure gauge 104 is provided instead of the flowmeter 4 (see FIG. 1) in an extrusion liquid route 5. Further, as shown in FIG. 12, instead of the flowmeter 4 (see FIG. 1), the pressure gauge 104 is connected with a control part 180 of the coating material filling and discharging device 101 according to the embodiment.

A flow of processing of filling a coating material in a coating material cartridge 30 in the coating material filling and discharging device 101 according to the embodiment is basically the same as the flow of the processing in the coating material filling and discharging device 1 according to the first embodiment, which is explained with reference to FIG. 4. In the coating material filling and discharging device 101 according to the embodiment, in step S103 of the flowchart shown in FIG. 4, it is determined whether or not filling of the coating material in the coating material cartridge 30 is completed based on a pressure drop of extrusion liquid, which is detected by the pressure gauge 104.

The flow of processing of discharging the coating material remaining inside a coating material storage bag 32 in the coating material filling and discharging device 101 according to the embodiment is basically the same as the flow of the processing in the coating material filling and discharging device 1 according to the first embodiment, which is explained with reference to FIG. 8. In the coating material filling and discharging device 101 according to the embodiment, in step S203 of the flowchart shown in FIG. 8, it is determined whether or not discharge of the coating material remaining inside the coating material storage bag 32 is completed based on a pressure increase of the extrusion liquid detected by the pressure gauge 104.

Figure 13:
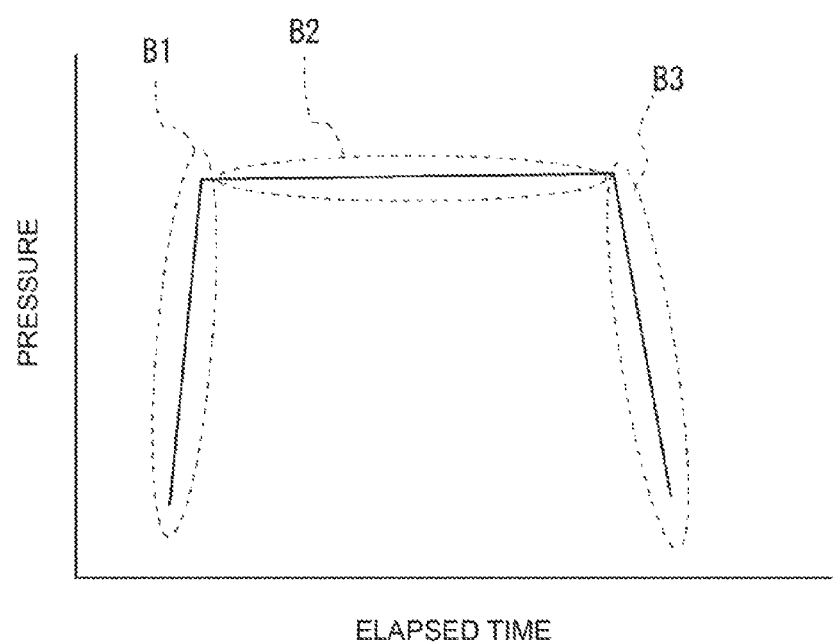
FIG. 13 is a view schematically explaining pressure changes of the extrusion liquid flowing in the extrusion liquid route in the process of filling the coating material in the coating material cartridge.

FIG. 13 a view schematically explaining changes in pressure of the extrusion liquid flowing in the extrusion liquid route 5 in a process of filling the coating material in the coating material cartridge 30. Here, the horizontal axis of the graph represents elapsed time, and the vertical axis of the graph represents pressure of the extrusion liquid detected by the pressure gauge 104. As shown by the broken line B1 in FIG. 13, when supply of the coating material to the coating material storage bag 32 begins, pressure of the extrusion liquid increases instantaneously. As shown by the broken line B2 in FIG. 13, after supply of the coating material to the coating material storage bag 32 begins, changes of pressure of the extrusion liquid are kept substantially constant. As shown by the broken line B3 in FIG. 13, pressure of the extrusion liquid drops rapidly when the extrusion liquid is no longer discharged from the case 31 as the coating material can no longer be supplied to the coating material storage bag 32 from a coating material supply part 2 due to completion of filling of the coating material cartridge 30. Therefore, when pressure of the extrusion liquid, which is detected by the pressure gauge 104, is dropped rapidly as shown by the broken line B3 in FIG. 13, it is possible to determine that filling of the coating material in the coating material cartridge 30 is completed. Because of this, it is possible to highly accurately detect timing when filling of the coating material in the coating material cartridge 30 is completed.

Figure 14:
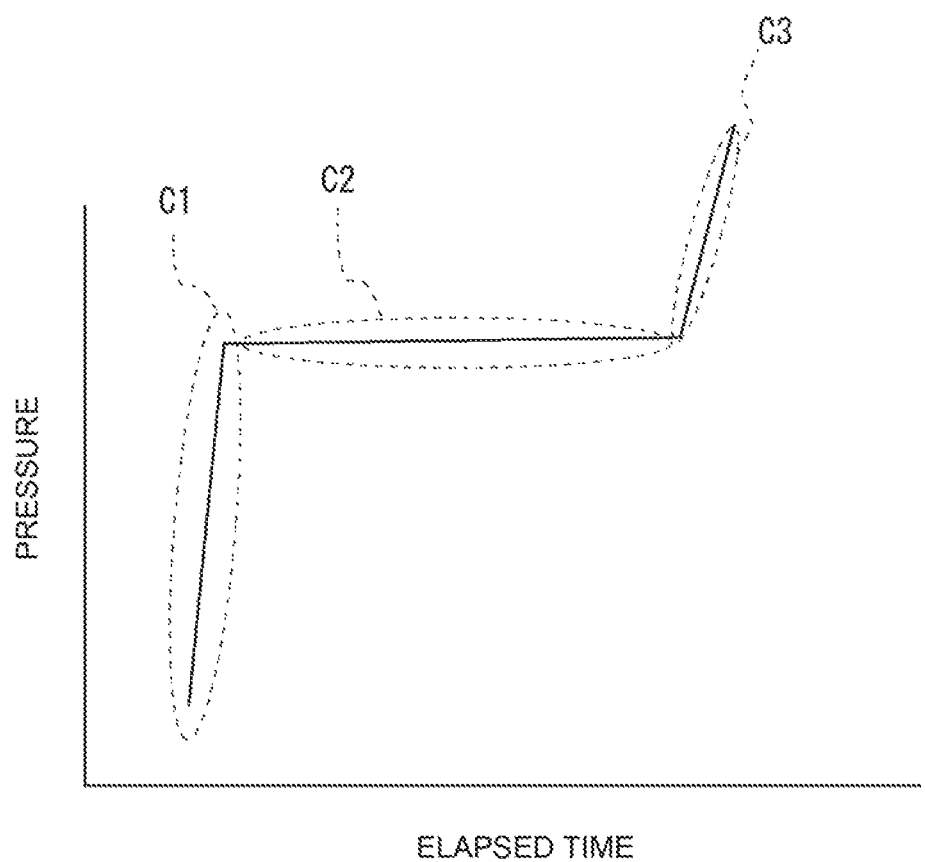
FIG. 14 is a view schematically explaining pressure changes of the extrusion liquid flowing in the extrusion liquid route in the process of discharging the coating material remaining inside the coating material storage bag.

FIG. 14 is a view schematically explaining pressure changes of the extrusion liquid flowing in the extrusion liquid route in the process of discharging the coating material remaining inside the coating material storage bag 32. As shown in the broken line C1 in FIG. 14, once supply of the extrusion liquid to a surrounding region 33 begins, pressure of the extrusion liquid increases instantaneously. As shown by the broken line C2 in FIG. 14, after supply of the extrusion liquid to the surrounding region 33 begins, changes of pressure of the extrusion liquid are kept substantially constant. As shown by the broken line C3 in FIG. 14, pressure of the extrusion liquid increases when the extrusion liquid can no longer be supplied to the surrounding region 33 from the extrusion liquid supply part 3 due to completion of discharge of the coating material remaining inside the coating material storage bag 32. Therefore, when pressure of the extrusion liquid detected by the pressure gauge 104 increases as shown by the broken line C3 in FIG. 14, it is possible to determine that discharge of the coating material remaining inside the coating material storage bag 32 is completed. Thus, it is possible to highly accurately detect timing when discharge of the coating material remaining inside the coating material storage bag 32 is completed.

The disclosure is not limited to the foregoing embodiments, and changes may be added as appropriate without departing from the gist of the disclosure.

What is claimed is:

1. A coating material filling and discharging device, which fills a coating material in a coating material cartridge in which a coating material storage bag is arranged inside a case, and discharges the coating material remaining inside the coating material storage bag by supplying extrusion liquid to a surrounding region outside the coating material storage bag within the case, the coating material filling and discharging device comprising:
   a coating material supply part configured to supply the coating material to the coating material storage bag;
   an extrusion liquid supply part configured to supply the extrusion liquid to the surrounding region and store the extrusion liquid discharged from the case;

an extrusion liquid route that connects the extrusion liquid supply part and the surrounding region with each other;

a flowmeter provided in the extrusion liquid route; and a control part configured to determine whether or not filling of the coating material in the coating material cartridge is completed based on a drop of flow speed of the extrusion liquid, which is detected by the flowmeter, while the coating material is supplied to the coating material storage bag from the coating material supply part.

2. The coating material filling and discharging device according to claim 1, wherein the control part is configured to determine whether or not discharge of the coating material remaining inside the coating material storage bag is completed, based on a drop of the flow speed of the extrusion liquid, which is detected by the flowmeter, while the extrusion liquid is supplied to the surrounding region from the extrusion liquid supply part.

3. The coating material filling and discharging device according to claim 1, wherein the control part is configured to determine that the filling of the coating material in the coating material cartridge is completed when the flow speed of the extrusion liquid detected by the flowmeter is dropped to a predetermined ratio with respect to a detected value while the coating material is filled in the coating material cartridge.

4. The coating material filling and discharging device according to claim 1, wherein the control part is configured to determine that the filling of the coating material in the coating material cartridge is completed when the flow speed of the extrusion liquid detected by the flowmeter is dropped to a predetermined threshold.

5. The coating material filling and discharging device according to claim 2, wherein the control part is configured to determine that the discharge of the coating material remaining inside the coating material storage bag is completed when the flow speed of the extrusion liquid detected by the flowmeter is dropped to a predetermined ratio with respect to a detected value while the coating material remaining inside the coating material storage bag is discharged.

6. The coating material filling and discharging device according to claim 2, wherein the control part is configured to determine that the discharge of the coating material remaining in the coating material storage bag is completed when the flow speed of the extrusion liquid detected by the flowmeter is dropped to a predetermined threshold.

7. A coating material filling and discharging device, which fills a coating material in a coating material cartridge in which a coating material storage bag is arranged inside a case, and discharges the coating material remaining inside the coating material storage bag by supplying extrusion liquid to a surrounding region outside the coating material storage bag within the case, the coating material filling and discharging device comprising:

a coating material supply part configured to supply the coating material to the coating material storage bag;

an extrusion liquid supply part configured to supply the extrusion liquid to the surrounding region and store the extrusion liquid discharged from the case;

an extrusion liquid route that connects the extrusion liquid supply part and the surrounding region with each other;

a pressure gauge provided in the extrusion liquid route; and a control part configured to determine whether or not filling of the coating material in coating material cartridge is completed based on a pressure drop of the extrusion liquid detected by the pressure gauge while the coating material is supplied to the coating material storage bag from the coating material supply part.

8. The coating material filling and discharging device according to claim 7 wherein the control part is configured to determine whether or not discharge of the coating material remaining inside the coating material storage bag is completed based on a pressure increase of the extrusion liquid detected by the pressure gauge while the extrusion liquid is supplied to the surrounding region.

* * * * *